(12) United States Patent
Zhang

(10) Patent No.: US 12,047,078 B2
(45) Date of Patent: Jul. 23, 2024

(54) OSCILLATOR CIRCUIT, DEVICE AND METHOD FOR GENERATING AN OSCILLATOR SIGNAL

(71) Applicant: ams International AG, Jona (CH)

(72) Inventor: Cheng Zhang, Graz (AT)

(73) Assignee: AMS INTERNATIONAL AG, Jona (CH)

( * ) Notice: Subject to any disclaimer, the term of this patent is extended or adjusted under 35 U.S.C. 154(b) by 20 days.

(21) Appl. No.: 18/011,021

(22) PCT Filed: Jun. 24, 2021

(86) PCT No.: PCT/EP2021/067350
§ 371 (c)(1),
(2) Date: Dec. 16, 2022

(87) PCT Pub. No.: WO2021/260112
PCT Pub. Date: Dec. 30, 2021

(65) Prior Publication Data
US 2023/0246634 A1 Aug. 3, 2023

(30) Foreign Application Priority Data
Jun. 25, 2020 (EP) .................................... 20182360

(51) Int. Cl.
*H03K 3/0231* (2006.01)
*H03K 3/011* (2006.01)
(Continued)

(52) U.S. Cl.
CPC ............. *H03K 3/354* (2013.01); *H03K 3/011* (2013.01); *H03K 3/012* (2013.01); *H03K 3/013* (2013.01); *H03K 3/0231* (2013.01)

(58) Field of Classification Search
CPC ........... H03B 5/20; H03B 5/24; H03K 3/011; H03K 3/012; H03K 3/013; H03K 3/0231; H03K 3/354
(Continued)

(56) References Cited

U.S. PATENT DOCUMENTS 5,699,024 A * 12/1997 Manlove ................. H03L 1/022
331/113 R
6,356,161 B1 3/2002 Nolan et al.
(Continued)

FOREIGN PATENT DOCUMENTS

EP 2541769 A1 1/2013
WO 2015183513 A1 12/2015

OTHER PUBLICATIONS

Mikuli'c et al., "A 1-MHz Relaxation Oscillator Core Employing a Self-Compensating Chopped Comparator Pair", ISCAS 2018, 4 pages.
(Continued)

*Primary Examiner* — Levi Gannon
(74) *Attorney, Agent, or Firm* — MH2 TECHNOLOGY LAW GROUP LLP

(57) ABSTRACT

An oscillator circuit includes a current controller, a first capacitor and a second capacitor. A current generator is coupled to the current controller, the first and the second capacitor, and is operable, under control of a control signal of the current controller, provide charging currents. A comparator stage comprises a first input coupled to the first capacitor, a second input coupled to the second capacitor and a reference input to be supplied with the reference voltage. The comparator stage further includes an oscillator output to provide a clock signal based on a comparison of the capacitor voltages and the reference voltage, respectively. A modulation circuit comprises an oscillator input to input the clock signal, a reference output is connected to the current gen-
(Continued)

erator, and is operable to alternate between the charging currents, such that a charging current is provided as reference current at the reference output and at least one charging current is provided to alternately charge/discharge the first capacitor and the second capacitor to respective capacitor voltages.

13 Claims, 3 Drawing Sheets

(51) Int. Cl.
*H03K 3/012* (2006.01)
*H03K 3/013* (2006.01)
*H03K 3/354* (2006.01)

(58) Field of Classification Search
USPC .................................................. 331/111, 143
See application file for complete search history.

(56) References Cited

U.S. PATENT DOCUMENTS

| | | | | |
|---|---|---|---|---|
| 6,369,665 | B1* | 4/2002 | Chee | H03K 4/502 |
| | | | | 331/175 |
| 7,034,627 | B1* | 4/2006 | Kudari | H03K 3/0231 |
| | | | | 331/111 |
| 11,043,936 | B1* | 6/2021 | Wu | H03K 3/011 |
| 2010/0237955 | A1* | 9/2010 | Mahooti | H03K 3/0231 |
| | | | | 331/66 |
| 2012/0319788 | A1 | 12/2012 | Wadhwa et al. | |
| 2012/0326796 | A1* | 12/2012 | Giacomini | H03K 3/354 |
| | | | | 331/108 R |
| 2015/0194949 | A1* | 7/2015 | McQuirk | H03K 5/00006 |
| | | | | 327/291 |
| 2016/0013753 | A1 | 1/2016 | Tam et al. | |
| 2017/0040944 | A1* | 2/2017 | Satoh | H03B 5/24 |
| 2018/0145665 | A1* | 5/2018 | Hurwitz | H03B 1/00 |
| 2018/0351509 | A1* | 12/2018 | Zhang | H03B 5/04 |
| 2020/0014372 | A1* | 1/2020 | Narwal | H03K 5/19 |

OTHER PUBLICATIONS

Martinez Martinez, J (EP Authorized Officer), International Search Report and Written Opinion in corresponding International Application No. PCT/EP2021/067350 mailed on Sep. 29, 2021, 13 pages.

* cited by examiner

OSCILLATOR CIRCUIT, DEVICE AND METHOD FOR GENERATING AN OSCILLATOR SIGNAL

CROSS-REFERENCE TO RELATED APPLICATIONS

The present application is the national stage entry of International Patent Application No. PCT/EP2021/067350, filed on Jun. 24, 2021, and published as WO 2021/260112 A1 on Dec. 30, 2021, which claims priority to EP Application No. 20182360.6, filed on Jun. 25, 2020, all of which are incorporated by reference herein in their entireties.

FIELD OF DISCLOSURE

The present disclosure relates to an oscillator circuit and to a method for generating an oscillator signal.

This patent application claims the priority of European patent application 20182360.6, the disclosure content of which is hereby incorporated by reference.

BACKGROUND

Oscillators are playing a key role in integrated circuit design. Almost every digital core needs some sort of clock generator to enable the operation of the circuit. There are many different possibilities to design an oscillator known in the art. For example, relaxation oscillators are widely used in audio systems. However, due to flicker noise in the charging current, the oscillator output may demonstrate low frequency jitter, which can deteriorate the audio performance.

A known relaxation oscillator is shown in FIG. 6. The depicted oscillator circuit comprises two current sources CS1, CS22, two capacitors C1, C2, two comparators CMP1, CMP2 and a SR latch LT. The two capacitors are charged alternatively to the reference voltage VREF and provide a clock signal CLK. An output frequency of the clock signal can be determined by the reference voltage, the capacitance values of the capacitors and the charging currents. In CMOS technology, the current sources, the reference voltage, and the comparators contribute to flicker noise, which results in low frequency jitter in the output clock signal. For oscillators used in audio applications, low frequency jitter would deteriorate the audio performance.

There are attempts to address this problem by using a compensation of the delay of the comparators and by the cancellation of the offset from the comparators. However, due to the offset cancellation of the comparators, the flicker noise of comparator may only be removed by chance. For example, in a two comparator topology input and output may be chopped by a frequency which is derived from the oscillation frequency so that the offset and the flicker noise of the comparator will only result in high frequency jitter. On the other hand, the current sources can be designed with correlation to the reference voltage, so that the flicker noise of the reference voltage has negligible impact to the final oscillating frequency. An example of this approach is making the value of the current sources proportional to the value of the voltage reference. However, the flicker noise of the current sources may still result in low frequency jitter. Since the current sources for the charging and discharging may typically be generated by a voltage-to-current converter and current mirrors, the flicker noise of current source originate from the flicker noise of the voltage-to-current converter and the current mirrors. The voltage-to-current converter usually comprise an opamp and a voltage-controlled current reference. Similar as the flicker noise of the mentioned reference voltage, the flicker noise of the opamp may also have negligible impact to the final oscillating frequency, if the current sources is designed with correlation to the reference voltage. But the flicker noise of the voltage-controlled current reference, as well as the flicker noise of the current mirrors may still result in low frequency jitter.

It is an object of the present disclosure to provide an oscillator circuit, a device and a method for generating an oscillator signal which allow for reduced impact of noise, including low frequency jitter.

These objects are achieved by the subject-matter of the independent claims. Further developments and embodiments are described in the dependent claims.

It is to be understood that any feature described in relation to any one embodiment may be used alone, or in combination with other features described herein, and may also be used in combination with one or more features of any other of the embodiments, or any combination of any other of the embodiments unless described as an alternative. Furthermore, equivalents and modifications not described below may also be employed without departing from the scope of the oscillator circuit, device and method for generating an oscillator signal which are defined in the accompanying claims.

SUMMARY

The following relates to an improved concept in the field of oscillator circuits. It is proposed to apply a modulation of charging/discharging currents and reference current, e.g. by using a dynamic element matching of a current generator and/or chopped comparators. For example, an oscillator comprises a number of current sources, two capacitors, two comparators and a logic, such as SR latch. The two capacitors are charged alternatively to a reference voltage, and therefore, the output frequency is determined by the reference voltage, the capacitance values and the charging currents. The oscillator output signal is used to alternate the charging currents and reference current of the current generator, thereby introducing a modulation of the currents used for charging. This modulation may significantly reduce low frequency jitter of the oscillator circuit, because it shift the flicker noise of the current generator to the high frequency band and thus only result in high frequency jitter at oscillator's output.

In one implementation the oscillator circuit comprises an operational amplifier, a resistive divider, a current generator with Dynamic Element Matching (DEM), capacitors, comparators and a logic circuit. The current generator is controlled by the operational amplifier output and provides the currents to the resistive divider and the capacitors. The oscillator output is used to control dynamic element matching of the current mirror. The reference voltage can be derived from any tapping point of the resistive divider so that the reference voltage are proportional to the charging current, and the oscillation frequency is mainly determined by the resistors and the capacitors.

In at least one embodiment an oscillator circuit comprises a current controller, a first capacitor and a second capacitor. A current generator is coupled to the current controller, the first and the second capacitor. A comparator stage comprises a first input which is coupled to the first capacitor, and a second input coupled to the second capacitor. Furthermore, the comparator stage comprises a reference input and an oscillator output. A modulation circuit comprises an oscillator input, a reference output connected to the current generator.

During operation the current generator, under control of a control signal of the current controller, generates and provides charging currents. The comparator stage is supplied with a reference voltage via the reference input. The comparator stage compares the capacitor voltages with the reference voltage, respectively. At the oscillator output a clock signal is provided based on the comparison of the capacitor voltages and the reference voltage, respectively. The modulation circuit alternates between the charging currents, such that a charging current is provided as reference current at the reference output. For example, the reference current is used to generate the control signal of the current controller to control the current generator. At least one charging current is provided to alternately charge/discharge the first capacitor and/or the second capacitor to respective capacitor voltages.

With conventional relaxation oscillators, a current source for charging or discharging the capacitors typically contains noise components such as flicker noise, which may result in low frequency jitter at a clock output. The low frequency jitter typically can only be reduced by enlarging the size or the current of the current mirror. This may not be efficient. The improved concept, however, due to the modulation circuit, the flicker noise from the current sources, can be modulated to a frequency determined by the clock signal, e.g. to a higher frequency. This is supported by feeding back changing charging current as reference current to generate the control signal by means of the current controller. Thus, low frequency noise, such as jitter, can be reduced without the cost of increased die size or power consumption. The proposed concept has different fields of application and there may be benefits to all applications prone to jitter, e.g. audio or optical signal processing. The oscillator circuit may be implemented as an integrated circuit or as part of an integrated, e.g. using CMOS technology.

In at least one embodiment the modulation circuit comprises a clock divider. The clock divider generates, from the clock signal, a divided clock signal having an oscillation frequency equal to an oscillation frequency of the clock signal divided by a predetermined integer number N, with N being equal or greater than 1.

The clock divider allows for adjusting the oscillation frequency used for modulation. The modulation can be set to a desired modulation frequency, e.g. by user interaction or by programming. Setting the integer value may be done in view of expected or actually occurring noise in the clock signal. For example, the predetermined integer number N can be set such that a noise component, is modulated to a higher frequency. Setting may be done during user interaction during operation of the oscillator circuit or by programming the integer value to the predetermined value. What is considered "higher frequency" depends largely on the application at hand.

Basically, the "higher frequency" is one at which the noise component, is getting negligible. For example, in audio applications the "higher frequency" may be one where jitter is no longer audible to a human and, thus, is negligible. However, the "higher frequency" may also be one at which further signal processing allows for removing the noise component, e.g. by signal filtering, or at which the noise component is no longer detectable.

In at least one embodiment the comparator stage comprises a first comparator, a second comparator and a logic. The first comparator comprises the first input coupled to the first capacitor and a first reference input. The second comparator comprises the second input coupled to the second capacitor and a second reference input. The logic is coupled to an output of the first comparator and to an output of the second comparator. Furthermore, the logic comprises the oscillator output. For example, the logic comprises a flip-flop, such as a SR latch, which generates the clock signal by toggling its output (e.g., the latch output oscillates between 0 and 1 or low and high state) when passed the input combination by the capacitor stage, i.e. from the two capacitors.

During operation of the oscillator circuit, the first comparator is supplied with the reference voltage. The second comparator is supplied with the reference voltage as well. The clock signal is provided at the oscillator output. In fact, the clock signal is based on a comparison of a capacitor voltage of the first capacitor with the reference voltage and a comparison of the capacitor voltage of the second capacitor with the reference voltage. The resulting clock signal is provided at the oscillator output. This way the two comparators may be charged/discharged alternately.

Due to continuous charging/discharging the clock signal with an oscillation frequency largely determined by the two capacitors.

In at least one embodiment the modulation circuit comprises a first chopper circuit and a second chopper circuit. The first chopper circuit connects alternately a capacitor voltage of the first capacitor or the reference voltage to the first input and the first reference input of the first comparator. The second chopper circuit connects alternately a capacitor voltage of the second capacitor or the reference voltage to the second input and the second reference input of the second comparator. Third connections are alternated according to the oscillation frequency of the divided clock signal. In other words, the comparators are chopped with the divided clock signal. As a result, a noise component, e.g. flicker noise from the comparator stage, is also modulated to higher frequency. The modulation circuit may only comprise chopper circuits or be complemented with other components to reduce noise, as discussed herein.

In at least one embodiment the current generator comprises a current mirror and a switching arrangement. The current mirror has at least two current sources, each of which are operable to, under control of the current controller, generate the charging currents. The switching arrangement alternately connects the current sources to the first capacitor and to the second capacitor. In a dynamic element matching operation switching states of the switching arrangement are alternated depending on the clock signal.

The dynamic element matching operation alternately connects one of the at least two current sources and, thus, one of two charging currents is provided as reference current at the reference output. For example, the reference current is arranged to generate the control signal of the current controller to control the current generator. This introduces a modulation of the two current sources to a frequency determined by the clock signal. Basically, the "dynamic element matching operation" is determined by a sequence of switching states and may involve switching of more than two current sources, e.g. three current sources. At least one of the corresponding charging currents is provided as reference current to the current controller.

In at least one embodiment the current mirror comprises a first current source and a second current source which generate a first and a second charging current, respectively.

The switching arrangement couples the first current source and the second current source to the first capacitor and to the second capacitor.

During operation in the dynamic element matching operation switching states of the switching arrangement alternate electrical connections to the first current source and the second current source. For example, in a first switching state the first current source is electrically connected to the first capacitor and the second current source is electrically connected to the reference output. In a second switching state, the first current source is electrically connected to the second capacitor and the second current source is electrically connected to the reference output. This way either a charging current of the first current source or a charging current of the second current source is provided as reference current via the reference output to the current controller. The respective other charging current is used to charge/discharge one or both capacitors, for example.

In at least one embodiment in the dynamic element matching operation the switching states of the switching arrangement are alternated according to the oscillation frequency of the divided clock signal. By using the divided clock signal noise components may be modulated to a higher frequency, such that their impact may be considered negligible or may be reduced by further signal processing.

In at least one embodiment the current mirror comprises a third current source which, under control of the current controller, generates a third charging current. The switching arrangement couples the third current source to the first capacitor and to the second capacitor.

In the dynamic element matching operation, switching states of the switching arrangement alternate electrical connections of the first current source, second current source and the third current source. In a first switching state, the first current source is electrically connected to the first capacitor, the second current source is electrically connected to the second capacitor and the third current source is electrically connected to the reference output. In a second switching state, the first current source is electrically connected to the second capacitor, the second current source is electrically connected to the reference output and the third current source is electrically connected to the first capacitor. In a third switching state, the first current source is electrically connected to the reference output, the second current source is electrically connected to the first capacitor and the third current source is electrically connected to the second capacitor.

This way alternately a charging current of the first, second or third current source is provided as reference current via the reference output to the current controller. The other charging currents are used to charge/discharge one or both capacitors, for example, and to generate the clock signal. The two capacitors may be charged/discharged in a balanced fashion, e.g. one after the other. This way the charging/discharging oscillates in view of the reference voltage and is detected by the comparator stage.

In at least one embodiment the modulation circuit further comprises a shift register. The shift register sets, in the dynamic element matching operation, switching states of the switching arrangement according to a sequence of bits, or a bit array. The shift register changes a switching state depending on the clock signal, e.g. synchronous to a high or low state of the clock signal.

For example, the shift register comprises a cascade of flip flops, sharing the same clock signal, in which the output of each flip-flop is connected to a "data" input of the next flip-flop in the chain, resulting in a circuit that shifts by one position the "bit array" stored in it, "shifting in" the data present at its input and 'shifting out' the last bit in the array, at each transition of the clock input. More generally, a shift register may be multidimensional, such that its "data in" and stage outputs are themselves bit arrays; this may be implemented by running several shift registers of the same bit-length in parallel.

For example, the shift register has saved a bit array with three bit entries according to three switching states discussed above. The switching states are defined as $(1,0,0)$ as first switching state, $(0,1,0)$ as second switching state and $(0,0,1)$ as third switching state. The shift register, under control of the clock signal, shifts by one position the "bit array", respectively, thereby altering the switching states.

In at least one embodiment the current controller comprises an operational amplifier. The operation amplifier comprises a first amplifier input to receive a reference voltage and a second amplifier input. An amplifier output of the operational amplifier is coupled to the current generator and is operable to provide via the amplifier output to control signal to the current generator. An amplifier feedback path comprises a current-to-voltage converter which connects the reference current via the reference output to the second amplifier input.

Basically, by implementing the operational amplifier the current generator can be considered feedback-assisted current generator or current mirror. The amplifier feedback path establishes a negative feedback to the operational amplifier, for example. The operational amplifier is fed with the difference in voltages corresponding to the reference current, and converted into a voltage by the current-to-voltage converter, and the reference voltage applied to the first amplifier input. Due to this feedback the control signal at the amplifier output controls the current sources of the current generator, e.g. in the current mirror, and thereby introduce the regulation.

In at least one embodiment the amplifier feedback path comprises a resistance divider to convert the reference current into a voltage to be input to the second amplifier input. The resistance divider constitutes a current-to-voltage converter.

In at least one embodiment the generated charging currents, except for noise, are the same in value. This makes sure that the modulation affects all current sources equally and results in the desired frequency, e.g. towards higher frequency in order to reduce the impact of unwanted noise components which result in unwanted jitter.

In at least one embodiment the comparator stage further comprises a first switch and a second switch. The first switch switches under control of the clock signal to either charge or discharge the first capacitor. The second switch switches under control of the inverse clock signal to either charge or discharge the second capacitor under control of the inverse clock signal. This way the capacitors are charged/discharged in an alternating fashion, i.e. when one capacitor is charged, the other is discharged, and vice versa. For example, a high state of the clock signal may initiate charging of one capacitor, while discharging the other. A high state of the inverse clock signal may initiate charging of latter capacitor, while discharging the first one, etc. In this way the charging/discharging resembles an oscillation and the clock signal has a defined oscillation frequency.

In at least one embodiment a device comprises an oscillator circuit according to the improved concept. Furthermore, the device comprise a host system which comprises at least one of an audio circuit or an optical sensor.

The device, or oscillation circuit enabled device, can be any device which relies on an accurate internal oscillator. In current solutions this degree of accuracy may require an external crystal. Thus, the proposed concept help elevate such requirement. In fact, there are applications in the field of audio and optical signal processing which may be prone to noise, such as jitter. The proposed concept allows for reducing the impact of noise components in such devices, including audio circuits and optical sensors.

The object is also solved by a method for generating an oscillator signal using an oscillator circuit comprising a current controller, a first capacitor and a second capacitor.

The method comprises the steps of generating and providing charging currents using a current generator which is coupled to the current controller. The first and the second capacitor are alternately charged or discharged under control of the current controller to respective capacitor voltages depending on the charging currents. A comparator stage is used to provide a clock signal based on a comparison of the capacitor voltages and a reference voltage, respectively. Finally, using a modulation circuit, the charging currents are alternated between the first capacitor and the second capacitor and a reference output depending on the clock signal.

Further embodiments of the method for generating an oscillator signal using an oscillator circuit according to the improved concept become apparent to a person skilled in the art from the embodiments of the oscillator circuit and the device comprising an oscillator circuit described above.

The following description of figures of example embodiments may further illustrate and explain aspects of the improved concept. Components and parts with the same structure and the same effect, respectively, appear with equivalent reference symbols. Insofar as components and parts correspond to one another in terms of their function in different figures, the description thereof is not necessarily repeated for each of the following figures.

DETAILED DESCRIPTION

Figure 1:
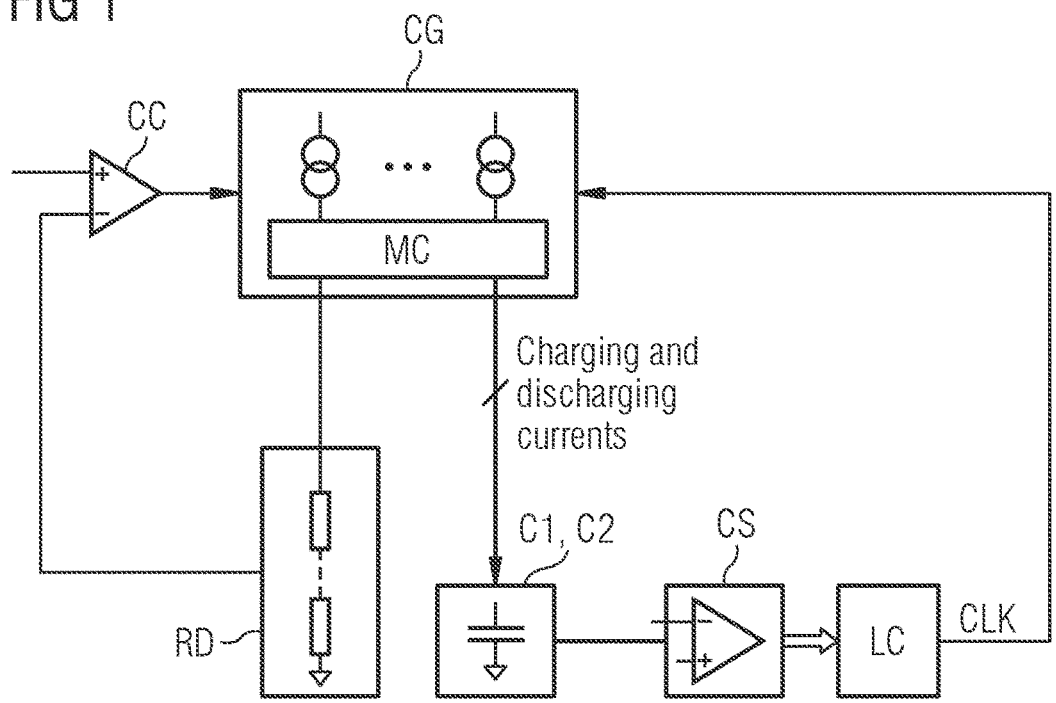
FIG. 1 shows an example embodiment of an oscillator circuit.

FIG. 1 shows an example embodiment of an oscillator circuit. The circuit comprises a current controller CC, a first capacitor C1, a second capacitor C2, as well as a current generator CG, a comparator stage CS, a logic LC and a modulation circuit MC. In the following the circuit layout is described. Any electrical connection not explicitly mentioned below can be construed from the circuit depicted in the accompanying Figures.

Figure 2:
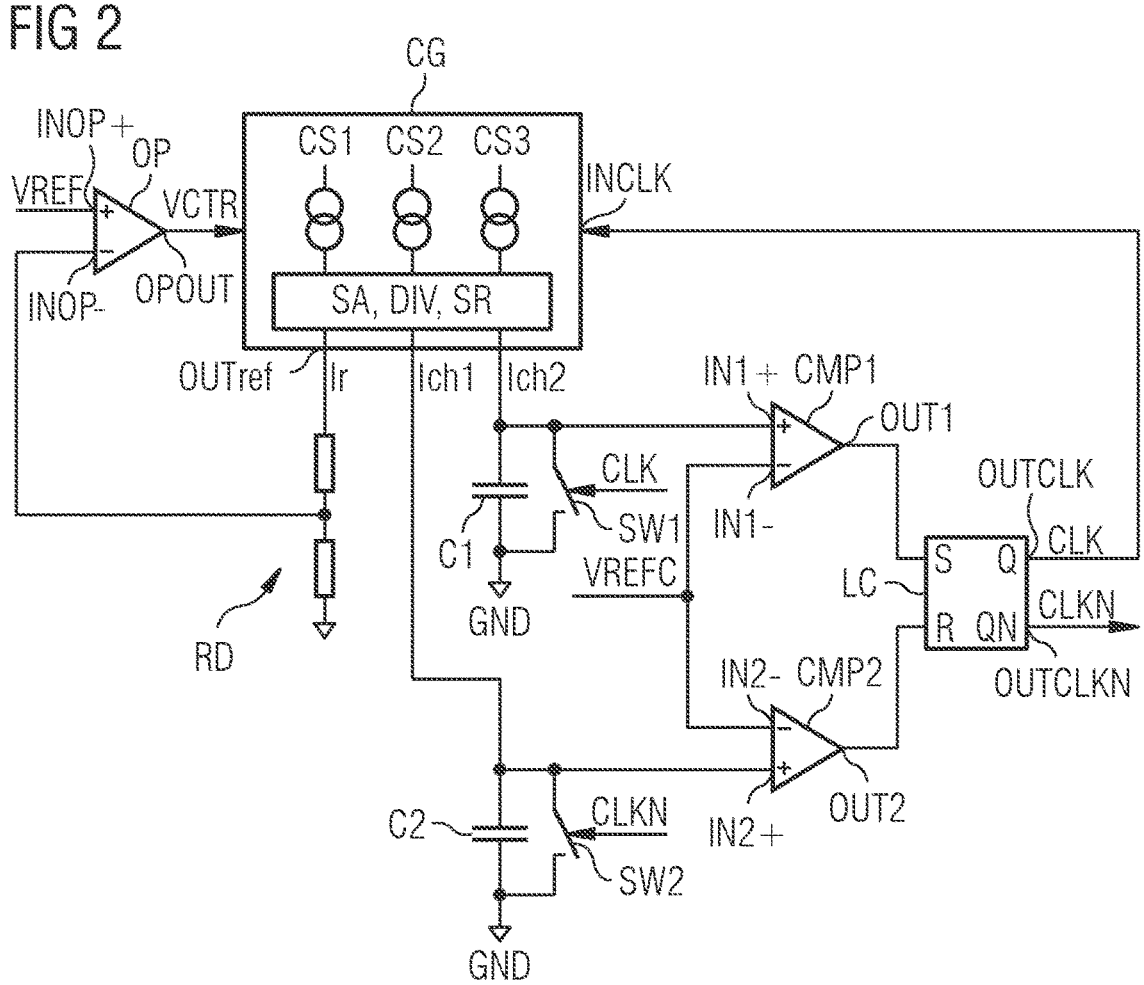
FIG. 2 shows another example embodiment of an oscillator circuit.

FIG. 2 shows an example embodiment of an oscillator circuit. In fact, this drawing depicts one possible implementation of the circuit shown in FIG. 1. The current controller CC comprises an operational amplifier OP which further comprises a first amplifier input INOP+ to receive a reference voltage VREF and a second amplifier input INOP−. An amplifier output OUTOP of the operational amplifier OP is coupled to the current generator CG.

The current generator CG comprises a current mirror with dynamic element matching (or DEM for short). The current mirror in this embodiment comprises three current sources CS1, CS2, CS3, each of which are operable to, under control of the current controller CC, generate respective charging currents. Basically, the operational amplifier OP and the current mirror form an op-amp current source which is operable to provide three different charging currents. The generated charging currents, except for noise, are the same in value.

The comparator stage comprises a first comparator CMP1 comprising a first input IN1+ coupled to the first capacitor C1 and a first reference input IN1− to be supplied with a reference voltage VREFC. The comparator stage also comprises a second comparator CMP2 having a second input IN2+ coupled to the second capacitor C2 and a second reference input IN2− to be supplied with the reference voltage VREFC. Furthermore, a logic LC, such as a SR flip flop, is coupled to an output OUT1 of the first comparator CMP1 and to an output OUT2 of the second comparator CMP2. The logic comprises a first oscillator output OUTCLK and a second oscillator output OUTCLKN.

The comparator stage further comprises a first switch SW1 and a second switch SW2 which are connected in parallel to the first capacitor C1 and the second capacitor C1, respectively. In addition, the first switch is connected to first input IN1+ and a ground potential GND. The second switch SW2 is connected to the second input IN2+ and the ground potential GND. The first and the second capacitor C1, C2 are connected to ground GND, too. The switches SW1, SW2 are operable to charge/discharge the first capacitor C1 under control of a clock signal CLK and an inverse clock signal CLKN to be provided by the logic LC at the first oscillator output OUTCLK and a second oscillator output OUTCLKN, respectively.

The modulation circuit MC comprises a clock divider DIV, a switching arrangement SA and a shift register SR. Only the switching arrangement SA is depicted in the drawing. Further details are shown in FIG. 2. The modulation circuit MC also comprises a reference output OUTref. Furthermore, the modulation circuit MC comprises an oscillator input INCLK which is connected to the first oscillator output OUTCLK of the logic LC.

The switching arrangement SA comprises a multiplexer, for example. The switching arrangement couples the first current source CS1, the second current source CS2 and the third current source CS3 of the current mirror to the first capacitor C1, the second capacitor C2 and to the second amplifier input INOP− of the operational amplifier OP. Actual electrical conductive connections are established according to switching states. In any switching state there is just a single current source electrically connected to the first capacitor C1, the second capacitor C2 and the second amplifier input INOP− at a time. However, as will be discussed below the electrical connections alternate according to a dynamic element matching operation.

An amplifier feedback path comprises a current-to-voltage converter RD, e.g. a resistance divider, and connects the reference output OUTref to the second amplifier input INOP−. The reference output OUTref is coupled to the switching arrangement SA. According to a dynamic element matching operation there is one current source CS1, CS2 or CS3 electrically connected via the current-to-voltage converter RD, or resistance divider, to the second amplifier input INOP−, but only one at a time.

FIG. 2 shows an example concept of a modulation circuit. Besides of the switching arrangement SA also the clock divider DIV and shift register SR are depicted. The switching arrangement SA comprises three sets of switches S1, S2, S3 each comprising three switches D[0], D[1] and D[2]. Each set is connected to a respective current source CS1, CS2 or CS3. A first set S1 couples the first current source CS1 of the current mirror to the first capacitor C1, the second capacitor C2 and to the second amplifier input INOP− of the operational amplifier OP. A second set S2 couples the second current source CS2 to the first capacitor C1, the second capacitor C2 and to the second amplifier input INOP− of the operational amplifier OP. A third set S3 couples the third current source CS3 of the current mirror to the first capacitor C1, the second capacitor C2 and to the second amplifier input INOP− of the operational amplifier OP.

Each set comprises a first switch D[0], a second switch D[1] and a third switch D[2]. The switches of a same type, e.g. all first switches D[0], are linked in the sense that they share the same switching state. For example, all first switches are either electrically conducting at a time, or not.

In order to change switching states and control the switches the modulation circuit comprises the clock divider DIV. The clock divider is connected to the first oscillator output OUTCLK to receive from the logic LC the clock signal CLK. The clock divider DIV generates from the clock signal CLK a divided clock signal CLK/N. This divided clock signal CLK/N has an oscillation frequency equal to an oscillation frequency of the clock signal CLK divided by a predetermined integer number N, with N being equal or greater than 1. The integer number N may be set during operation, e.g. by a customer. In some embodiments N equals 8.

The divided clock signal CLK/N is output by the clock divider DIV and input into the shift register SR. The shift register SR is arranged to save a sequence of bits, or bit array. Switching states of the switching arrangement SA can be set or altered by means of the shift register according to a sequence of bits. A given bit defines a switching state, e.g. indicates which of the first switches D[0], second switches D[1] and third switches D[2] is electrically conductive at a time. The shift register SR changes the switching states at a rate defined by the clock signal CLK, e.g. divided clock signal CLK/N, resulting from the pre-determined integer number N.

Figure 3:
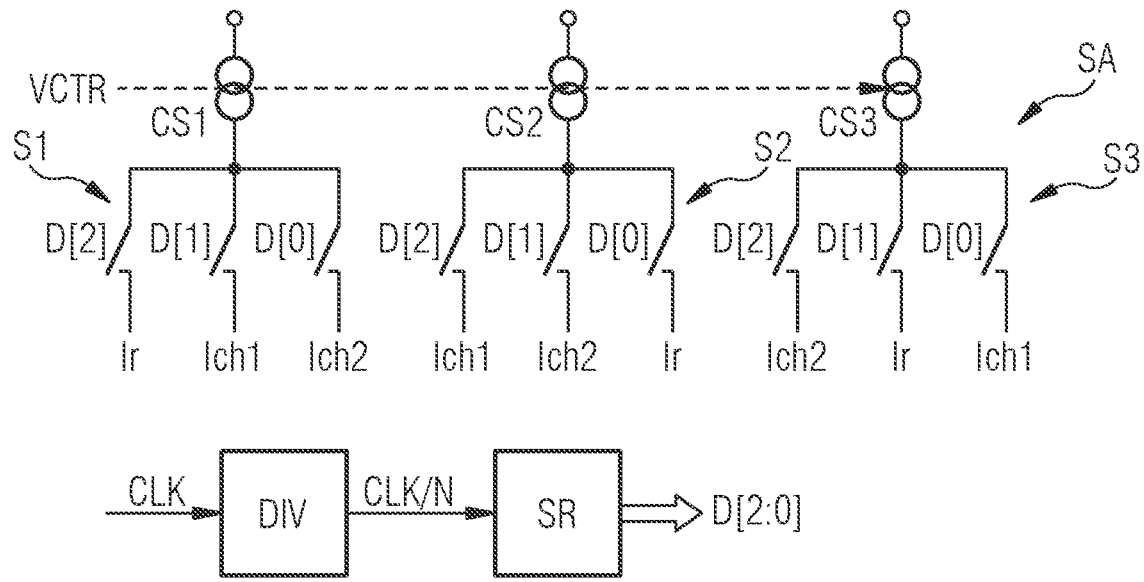
FIG. 3 shows an example concept of a modulation circuit.
Figure 4:
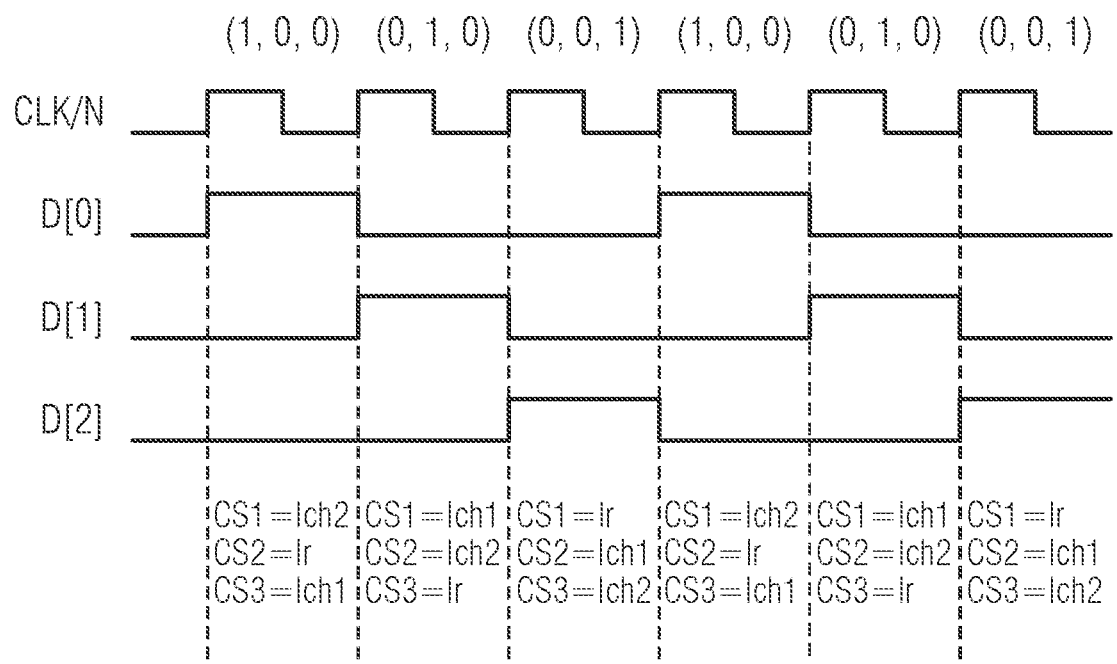
FIG. 4 shows an example timing diagram.

FIG. 3 shows an example timing diagram. The oscillator circuit including the modulation circuit discussed in the previous Figures provides a clock signal CLK. This signal is generated by alternatively charging and/or discharging the two capacitors C1, C2 to the reference voltage VREFC. This is achieved by the comparator stage and operating the first switch SW1 under control of the clock signal CLK and the second switch SW2 under control of the inverse clock signal CLKN. This way the first capacitor C1 and the second capacitor C2 are alternately charged and discharged to ground GND.

In parallel to this operation in the dynamic element matching operation switching states of the switching arrangement SA alternate electrical connections of the first current source CS1, second current source CS2 and the third current source CS3. Three switching state are defined and represented by a sequence of bits. This sequence of bits is stored on or applied to the shift register. A given bit from the sequence represents a determined switching state. The shift register SR changes the switching states at the rate defined by the clock signal CLK, e.g. divided clock signal CLK/N resulting from the pre-determined integer number N. This way the bits, and thereby switching states are changed sequentially which, in turn, defines the dynamic element matching operation. A consequence different charging currents are applied to the two capacitors and fed back as reference current, and converted into a voltage by the resistance divider RD, to the reference output OUTref of the current controller CC, e.g. the operational amplifier OP. The drawing also shows a representation of the divides clock signal CLK/N. It is apparent that the switching states are alternated according to the oscillation frequency of the divided clock signal.

In an example dynamic element matching operation the following switching states. In a first switching state (1,0,0), or D[0]=1, D[1]=0, D[2]=0, the first current source CS1 is electrically connected to the first capacitor C1, the second current source CS2 is electrically connected to the reference output OUTref and the third current source CS3 is electrically connected to the second capacitor C2. In this state the first switches D[0] are electrically conductive and the other D[1] and D[2] are open. This is represented as a high state in the D[0] graph. In this state the first current source CS1 provides a charging current Ich2 to the first capacitor C1, the second current source CS2 provides a reference current Ir to the reference output OUTref and the third current source CS3 provides a charging current Ich1 to the second capacitor C2.

In a second switching state (0,1,0), or D[0]=0, D[1]=1, D[2]=0, the first current source CS1 is electrically connected to the second capacitor C2, the second current source CS2 is electrically connected to the first capacitor C1 and the third current source CS3 is electrically connected to the reference output OUTref. In this state the second switches D[1] are electrically conductive and the other D[0] and D[2] are open. This is represented as a high state in the D[1] graph. In this state the first current source CS1 provides the charging current Ich1 to the second capacitor C2, the second current source CS2 provides the charging current Ich2 to the first capacitor C1 and the third current source CS3 provides the reference current Ir to the reference output OUTref.

In a third switching state (0,0,1), or D[0]=0, D[1]=0, D[2]=1, the first current source CS1 is electrically connected to the reference output OUTref, the second current source CS2 is electrically connected to the second capacitor C2 and the third current source CS3 is electrically connected to the first capacitor C1. In this state the third switches D[2] are electrically conductive and the other D[0] and D[1] are open. This is represented as a high state in the D[2] graph. In this state the first current source CS1 provides the reference charging current Ir to the reference output OUTref, the second current source CS2 provides the charging current Ich1 to the second capacitor C2, and the third current source CS3 provides the charging current Ich2 to the first capacitor C1.

In other words, throughout the dynamic element matching operation one of the current sources provides the reference current Ir, while the remaining two current sources provide the charging currents Ich1, Ich2. The switching state are changed sequentially according to the sequence of bits so that in a sequential manner the three current sources CS1, CS2, CS3 provide the reference current Ir, while the remaining two current sources provide the charging currents Ich1, Ich2.

Figure 5:
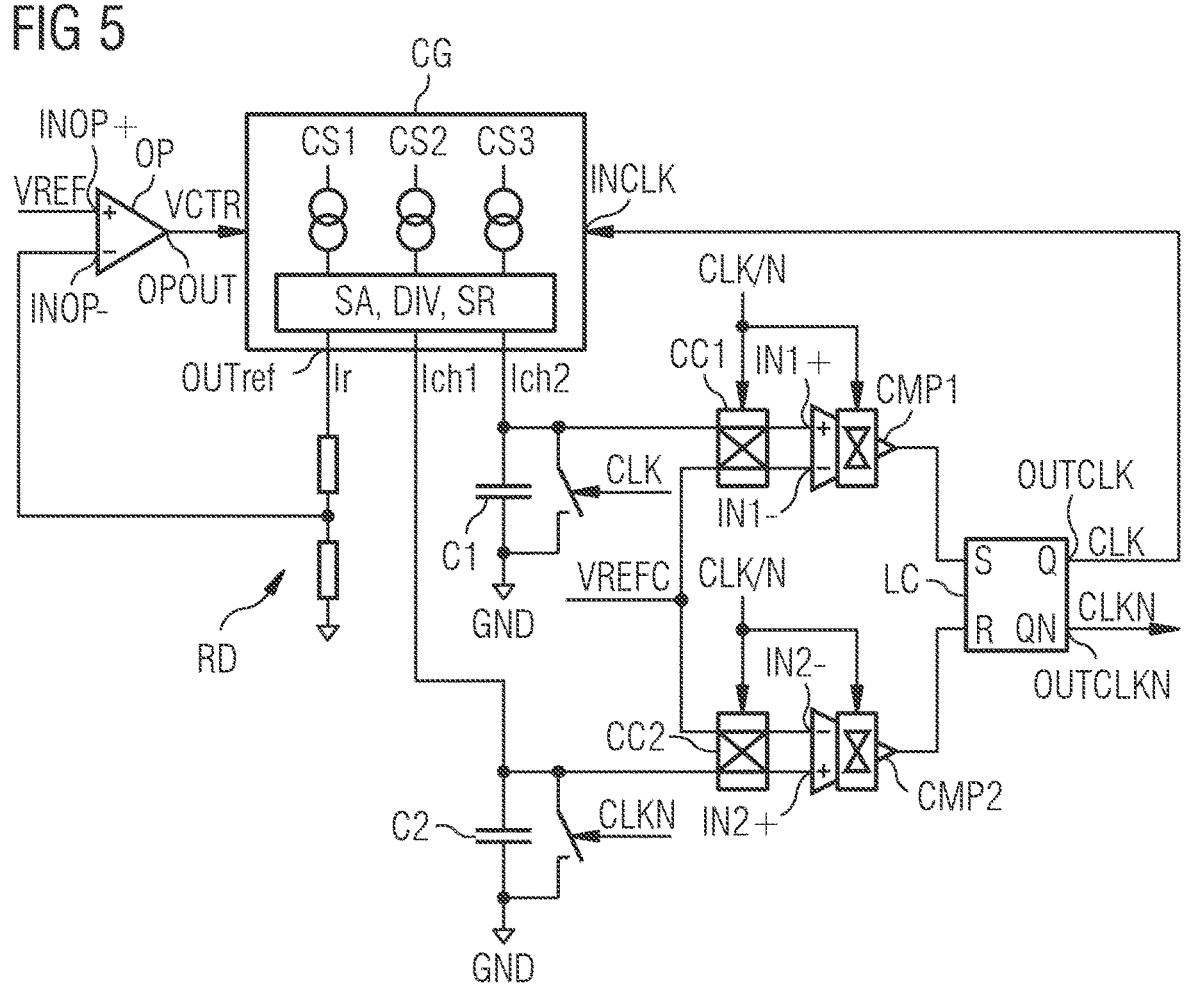
FIG. 5 shows another example embodiment of an oscillator circuit.
Figure 6:
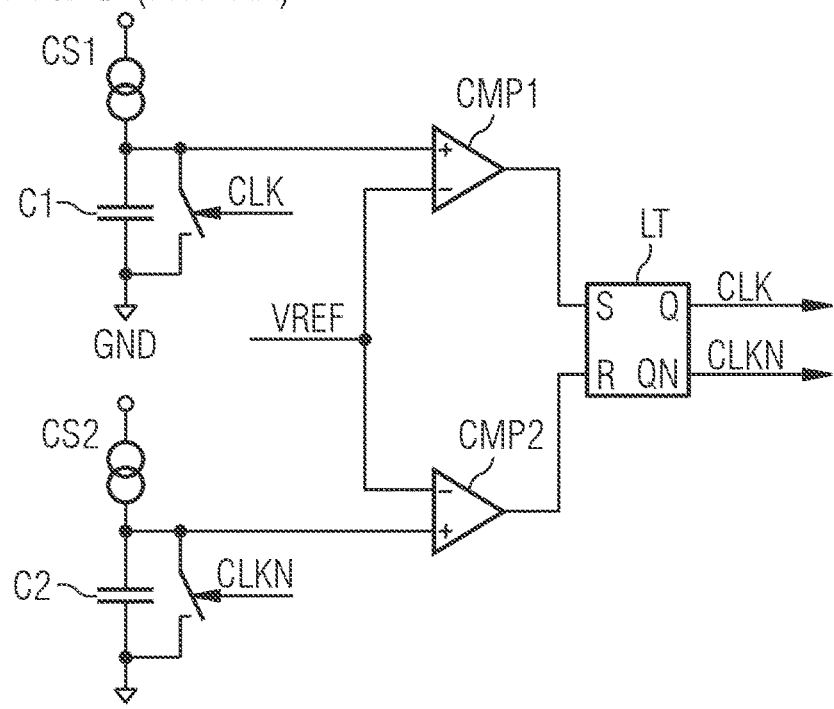
FIG. 6 shows a prior art example embodiment of an oscillator circuit.

FIG. 5 shows another example embodiment of the oscillator circuit. This embodiment is based on the one shown in FIG. 1 but is supplemented with chopper circuits. The comparators C1, C2 are chopped with CLK/N.

In more detail, a first chopper circuit CC1 is coupled between the input side IN1+, IN1− of the first comparator CMP1 while the first comparator CMP1 changes its polarity inside based on the state of CC1. Similarly, a second chopper circuit CC2 is coupled between the input side IN2+, IN2− of the second comparator CMP2 while the second comparator CMP2 changes its polarity inside based on the state of CC1.

In operation, the first chopper circuit CC1 alternately connects a capacitor voltage of the first capacitor C1 or the reference voltage VREFC to the first input IN1+ and the first reference input IN1− of the first comparator CMP1. At the same time, the second chopper circuit CC2 alternately connects a capacitor voltage of the second capacitor C2 or the reference voltage VREFC to the second input IN2+ or the second reference input IN2− of the second comparator CMP2. Said connections are alternated according to the oscillation frequency of the divided clock signal CLK/N. In coordination, the polarity of the first comparator CMP1 and the second comparator CMP2 are changed according to the oscillation frequency of the divided clock signal CLK/N. As a result, another modulation is introduced and the flicker noise from the comparators is also modulated to higher frequency.

Although this description of the improved concept contains many specifics, these should not be interpreted as limitations on the scope of the concept or what has or can be claimed, but rather as descriptions of features specific to certain embodiments of the invention. Certain features described in this disclosure in connection with separate embodiments may also be implemented in combination in a single embodiment. On the other hand, various features described in connection with a single embodiment can also be implemented in several embodiments separately or in any suitable sub-combination. In addition, although features may be described above as acting in certain combinations and even originally claimed as such, in some cases one or more features may be excised of a claimed combination, and the claimed combination may be directed to a sub-combination or variation of a sub-combination.

Accordingly, even if the operations in the drawings are presented in a specific order, this should not be understood to mean that these operations must be performed in the order shown or in sequential order, or that all the operations shown must be performed to achieve the desired results. Under certain circumstances, multitasking and parallel processing may be advantageous.

A number of implementations were described. Nevertheless, various modifications can be made without deviating from the spirit and scope of the invention. Accordingly, other implementations are within the scope of the claims.

The invention claimed is:

1. An oscillator circuit, comprising:
   a current controller, a first capacitor and a second capacitor,
   a current generator coupled to the current controller, the first and the second capacitor, and is operable, under control of a control signal of the current controller, provide charging currents,
   a comparator stage comprising a first input coupled to the first capacitor, a second input coupled to the second capacitor and a reference input to be supplied with the reference voltage, and further comprising an oscillator output to provide a clock signal based on a comparison of the capacitor voltages and the reference voltage, respectively, and
   a modulation circuit comprising an oscillator input to input the clock signal, a reference output is connected to the current generator, and being operable to alternate between the charging currents, such that a charging current is provided as reference current at the reference output and at least one charging current is provided to alternately charge/discharge the first capacitor and the second capacitor to respective capacitor voltages,
   wherein the current generator comprises a current mirror having at least two current sources, each being operable to, under control of the current controller, generate the charging currents, and a switching arrangement alternately connecting the current sources to the first capacitor and to the second capacitor; wherein in a dynamic element matching operation switching states of the switching arrangement are alternated depending on the clock signal, and
   wherein the current mirror comprises a third current source being operable to, under control of the current controller, generate a third charging current, the switching arrangement couples the third current source to the first capacitor and to the second capacitor;
   wherein in the dynamic element matching operation switching states of the switching arrangement alternate electrical connections of the first current source, second current source and the third current source such that:
   in the first switching state, the first current source is electrically connected to the first capacitor, the second current source is electrically connected to the second capacitor and the third current source is electrically connected to the reference output,
   in a second switching state, the first current source is electrically connected to the second capacitor, the second current source is electrically connected to the reference output and the third current source is electrically connected to the first capacitor, and
   in a third switching state, the first current source is electrically connected to the reference output, the second current source is electrically connected to the first capacitor and the third current source is electrically connected to the second capacitor.

2. The oscillator circuit according to claim 1, wherein the modulation circuit comprises a clock divider operable to generate from the clock signal a divided clock signal having an oscillation frequency equal to an oscillation frequency of the clock signal divided by a predetermined integer number N, with N being equal or greater than 1.

3. The oscillator circuit according to claim 2, wherein in a dynamic element matching operation the switching states of the switching arrangement are alternated according to the oscillation frequency of the divided clock signal.

4. The oscillator circuit according to claim 1, wherein the comparator stage comprises:
   a first comparator comprising the first input coupled to the first capacitor and a first reference input to be supplied with the reference voltage,
   a second comparator comprising the second input coupled to the second capacitor and a second reference input to be supplied with the reference voltage, and
   a logic coupled to an output of the first comparator and to an output of the second comparator and comprising the oscillator output to provide the clock signal.

5. The oscillator circuit according to claim 4, wherein the modulation circuit comprises:
   a first chopper circuit operable to connect alternately a capacitor voltage of the first capacitor or the reference voltage to the first input and the first reference input of the first comparator, and a second chopper circuit operable to connect alternately a capacitor voltage of the second capacitor or the reference voltage to the second input or the second reference input of the second comparator; wherein said connections are alternated according to the oscillation frequency of the divided clock signal.

6. The oscillator circuit according to claim 1, wherein:

the current mirror comprises a first current source and a second current source which generate a first and a second charging current, respectively, and the switching arrangement couples the first current source and the second current source to the first capacitor and to the second capacitor; wherein in the dynamic element matching operation switching states of the switching arrangement alternate electrical connections of the first current source and the second current source such that:

in a first switching state the first current source is electrically connected to the first capacitor and the second current source is electrically connected to the reference output, or in a second switching state the first current source is electrically connected to the second capacitor and the second current source is electrically connected to the reference output.

7. The oscillator circuit according to claim 1, wherein the modulation circuit further comprises a shift register operable to, in the dynamic element matching operation, set switching states of the switching arrangement according to a sequence of bits, wherein the shift register changes a switching state depending on the clock signal.

8. The oscillator circuit according to claim 1, wherein:

the current controller comprises an operational amplifier comprising a first amplifier input to receive a reference voltage and a second amplifier input, an amplifier output of the operational amplifier is coupled to the current generator and operable to provide via the amplifier output the control signal to the current generator, and an amplifier feedback path comprising a current-to-voltage converter connects the reference output to the second amplifier input.

9. The oscillator circuit according to claim 8, wherein the amplifier feedback path comprises a resistance divider to convert the reference current into a voltage to be input to the second amplifier input.

10. The oscillator circuit according to claim 1, wherein the generated charging currents, except for noise, are the same in value.

11. The oscillator circuit according to claim 1, wherein the comparator stage further comprises:

a first switch operable to charge/discharge the first capacitor under control of the clock signal, and a second switch operable to charge/discharge the second capacitor under control of the inverse clock signal.

12. A device comprising an oscillator circuit according to claim 1, and a host system comprising at least one of:

an audio circuit, or an optical sensor.

13. An oscillator circuit, comprising:

a current controller, a first capacitor and a second capacitor, a current generator coupled to the current controller, the first and the second capacitor, and is operable, under control of a control signal of the current controller, provide charging currents, a comparator stage comprising a first input coupled to the first capacitor, a second input coupled to the second capacitor and a reference input to be supplied with the reference voltage, and further comprising an oscillator output to provide a clock signal based on a comparison of the capacitor voltages and the reference voltage, respectively, and a modulation circuit comprising an oscillator input to input the clock signal, a reference output is connected to the current generator, and being operable to alternate between the charging currents, such that a charging current is provided as reference current at the reference output and at least one charging current is provided to alternately charge/discharge the first capacitor and the second capacitor to respective capacitor voltages, a second comparator comprising the second input coupled to the second capacitor and a second reference input to be supplied with the reference voltage, a logic coupled to an output of the first comparator and to an output of the second comparator and comprising the oscillator output to provide the clock signal, and a second chopper circuit operable to connect alternately a capacitor voltage of the second capacitor or the reference voltage to the second input or the second reference input of the second comparator; wherein said connections are alternated according to the oscillation frequency of the divided clock signal, wherein the comparator stage comprises a first comparator comprising the first input coupled to the first capacitor and a first reference input to be supplied with the reference voltage, and wherein the modulation circuit comprises a first chopper circuit operable to connect alternately a capacitor voltage of the first capacitor or the reference voltage to the first input and the first reference input of the first comparator.

* * * * *